(12) United States Patent
Inoue

(10) Patent No.: US 12,082,350 B2
(45) Date of Patent: Sep. 3, 2024

(54) SEMICONDUCTOR DEVICE

(71) Applicant: SUMITOMO ELECTRIC DEVICE INNOVATIONS, INC., Kanagawa (JP)

(72) Inventor: Shingo Inoue, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/923,765

(22) Filed: Jul. 8, 2020

(65) Prior Publication Data

US 2020/0404794 A1 Dec. 24, 2020

Related U.S. Application Data

(63) Continuation of application No. 16/343,622, filed as application No. PCT/JP2018/028924 on Aug. 1, 2018, now Pat. No. 10,750,621.

(30) Foreign Application Priority Data

Aug. 2, 2017 (JP) .................................. 2017-150035

(51) Int. Cl.
*H05K 3/34* (2006.01)
*H01L 23/00* (2006.01)
*H01L 25/00* (2006.01)

(52) U.S. Cl.
CPC .......... *H05K 3/3421* (2013.01); *H01L 24/27* (2013.01); *H01L 24/83* (2013.01); *H01L 25/50* (2013.01);

(Continued)

(58) Field of Classification Search
CPC ....... H05K 3/3421; H01L 24/27; H01L 24/83; H01L 25/50; H01L 2224/2732; H01L 2224/83855; H01L 2924/17788
See application file for complete search history.

(56) References Cited

U.S. PATENT DOCUMENTS 4,323,719 A 4/1982 Green
5,910,010 A * 6/1999 Nishizawa ........ H01L 23/49575
438/15

(Continued)

FOREIGN PATENT DOCUMENTS

EP 0595600 * 10/1993 ............. H01L 23/66
JP 11-307664 11/1999

(Continued)

OTHER PUBLICATIONS

Written Opinion (International Searching Authority) for PCT/JP2018/028924 dated Oct. 16, 2018.

(Continued)

*Primary Examiner* — Mohammad M Choudhry
(74) *Attorney, Agent, or Firm* — Smith, Gambrell & Russell, LLP.

(57) ABSTRACT

A semiconductor device includes a metal base, a semiconductor chip provided on the metal base, and a frame work located on the metal base and having a metal pattern of an input pattern, an output pattern, and a bias pad. The bias pad and the input pattern or the output pattern are electrically connected by a conductor located on the frame work. The conductor has a characteristic of isolation at a frequency around an input signal or an output signal of the semiconductor device.

15 Claims, 18 Drawing Sheets

(52) U.S. Cl.
CPC ............... *H01L 2224/2732* (2013.01); *H01L 2224/83855* (2013.01); *H01L 2924/17788* (2013.01)

(56) References Cited

U.S. PATENT DOCUMENTS

| | | | | |
|---|---|---|---|---|
| 6,144,571 | A | * | 11/2000 | Sasaki .................. H01L 25/165 363/144 |
| 2007/0222040 | A1 | * | 9/2007 | Lin ..................... H01L 21/4828 257/666 |
| 2009/0120684 | A1 | | 5/2009 | Kasai et al. |
| 2009/0298219 | A1 | | 12/2009 | Ohmoto et al. |
| 2010/0093131 | A1 | | 4/2010 | Maeda |
| 2011/0026334 | A1 | * | 2/2011 | Bae ..................... G11C 7/1078 365/189.11 |
| 2011/0133224 | A1 | * | 6/2011 | Zoorob ............... H01L 25/0753 257/88 |
| 2015/0334838 | A1 | * | 11/2015 | Ogawa .................. H05K 1/181 361/760 |
| 2016/0211203 | A1 | * | 7/2016 | Huang ................ H01L 23/4952 |
| 2016/0379954 | A1 | * | 12/2016 | Cahill ..................... H01L 23/66 257/659 |
| 2017/0102509 | A1 | * | 4/2017 | Tuin ..................... G02B 6/4257 |

FOREIGN PATENT DOCUMENTS

| | | |
|---|---|---|
| JP | 2011-165931 | 8/2011 |
| JP | 2012-221992 | 11/2012 |
| JP | 2014-132651 | 7/2014 |

OTHER PUBLICATIONS

International Search Report for PCT/JP2018/028924 dated Oct. 16, 2018.

* cited by examiner

[Fig. 1]
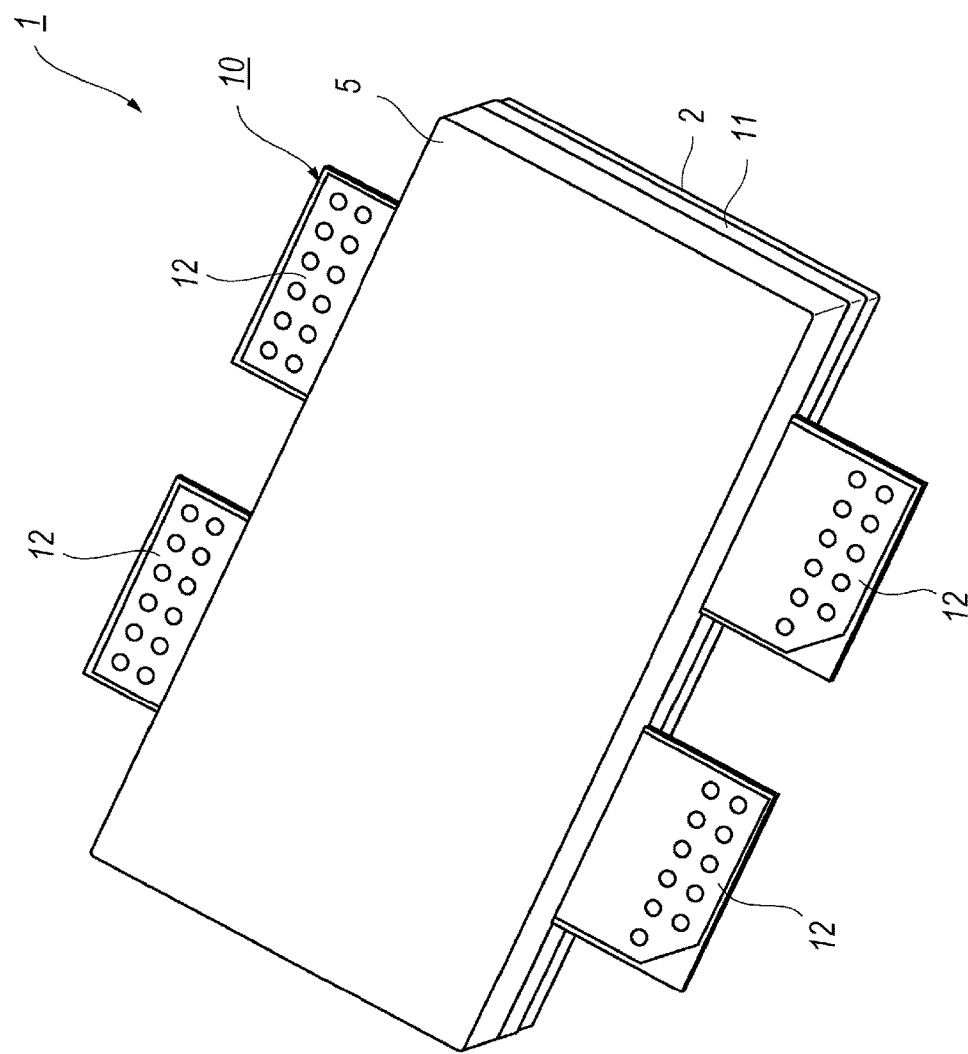

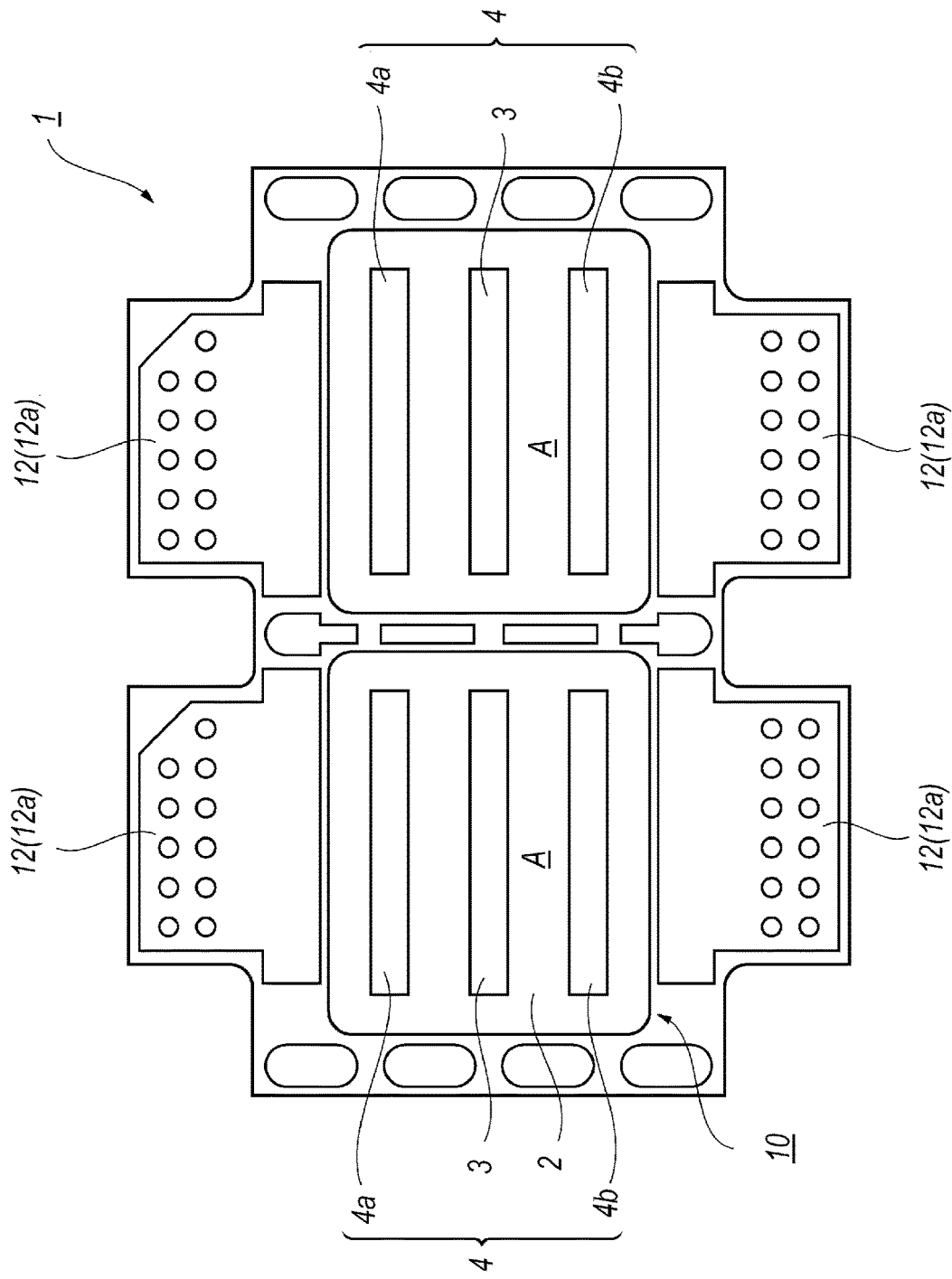
[Fig. 2]

[Fig. 3]
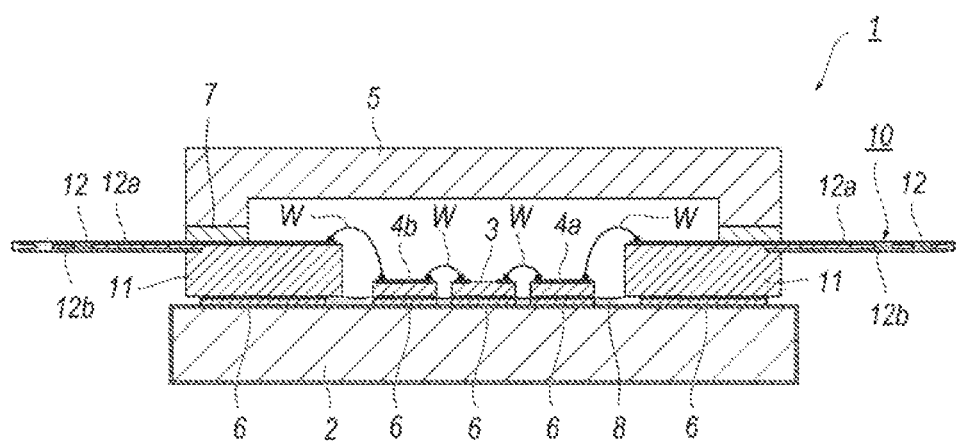

[Fig. 4A]
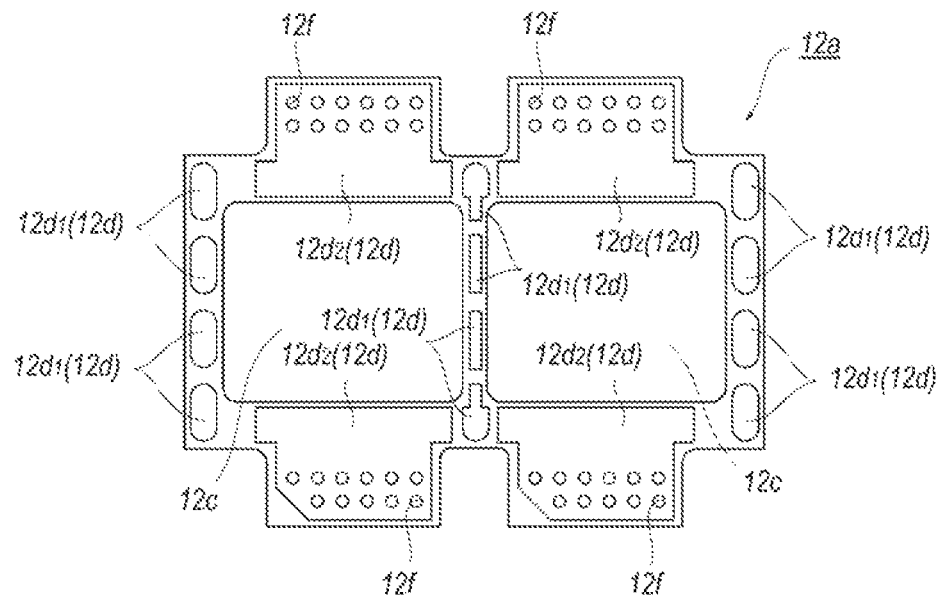
[Fig. 4B]
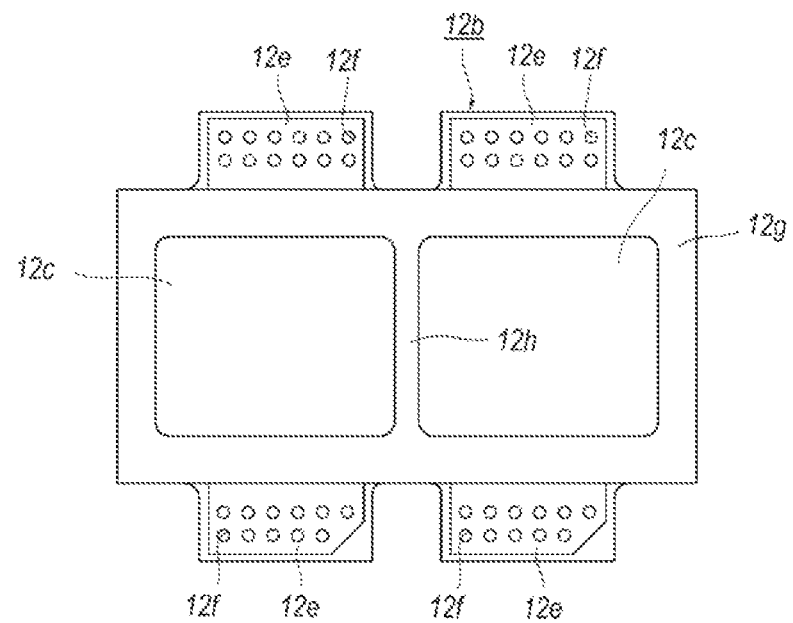

[Fig. 5A]
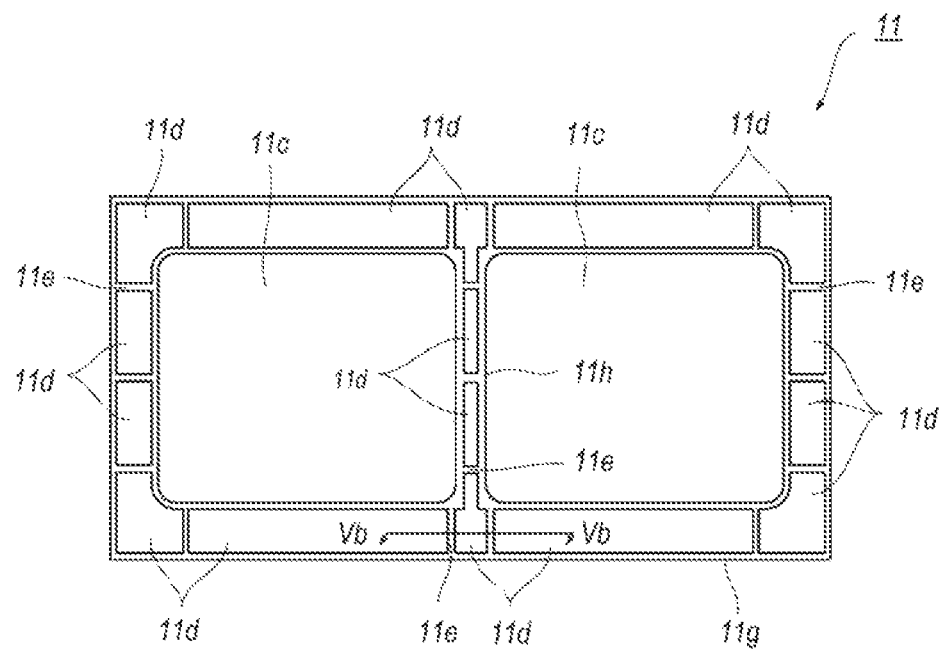
[Fig. 5B]
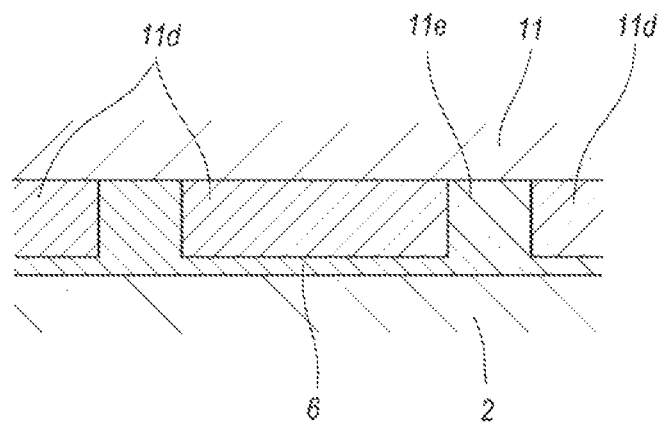

[Fig. 6A]
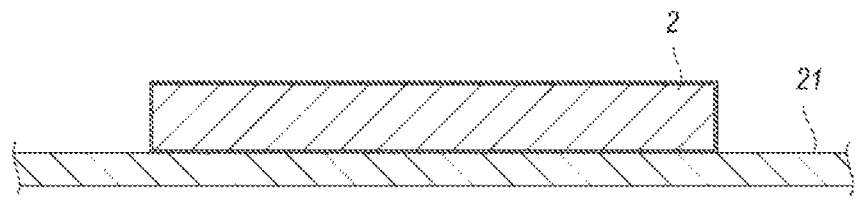
[Fig. 6B]
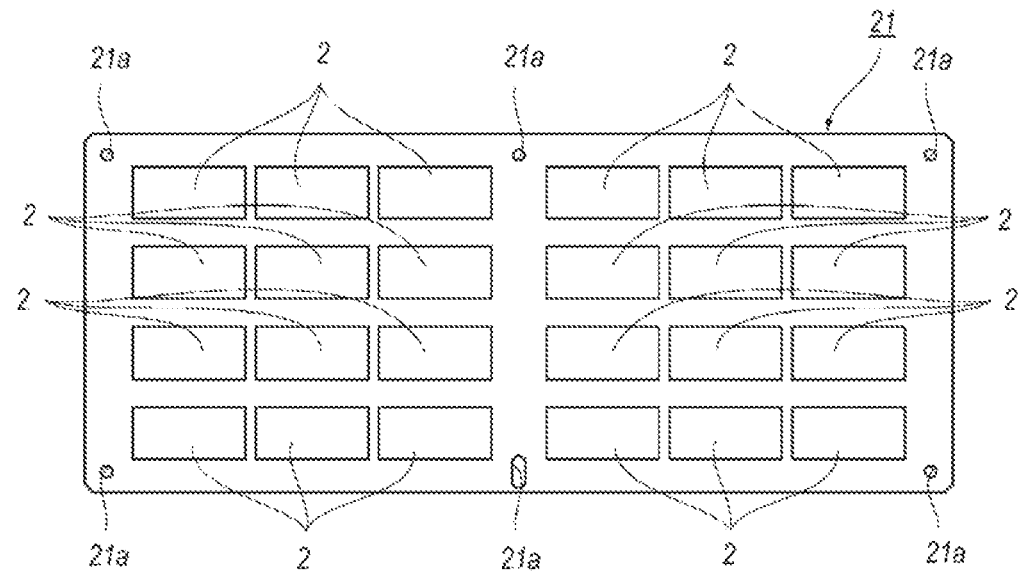

[Fig. 7A]
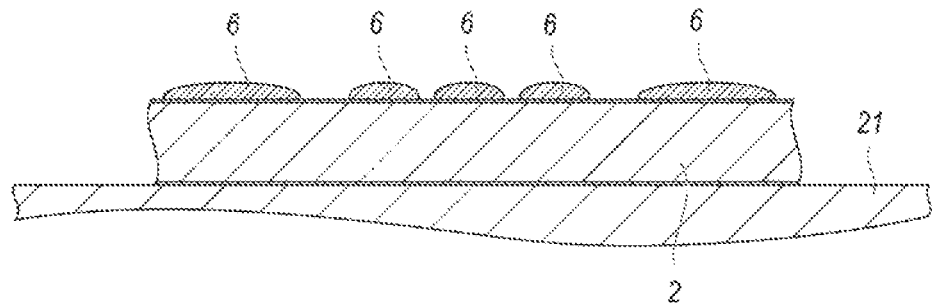
[Fig. 7B]
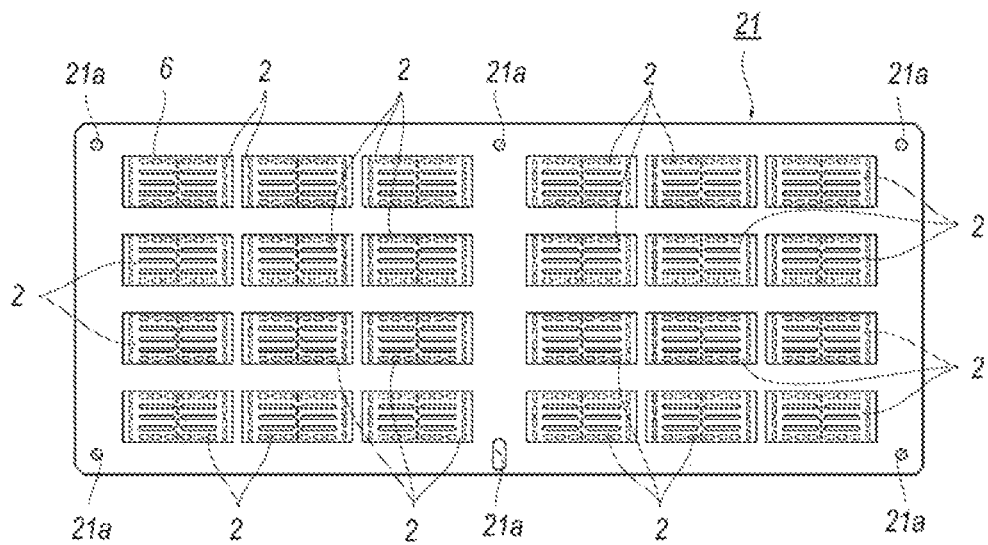
[Fig. 8A]
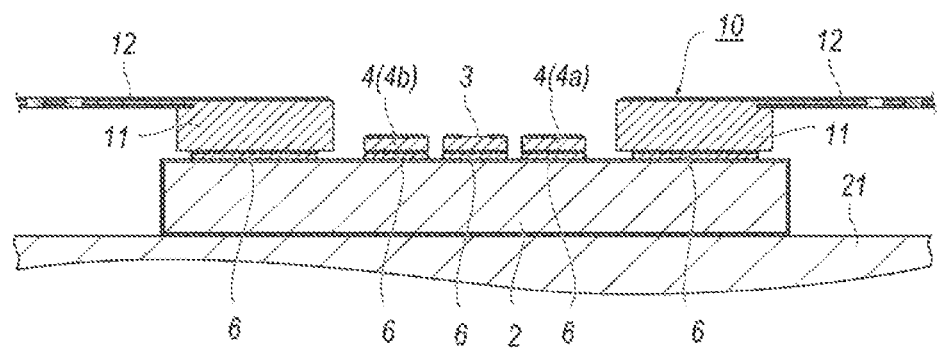

[Fig. 8B]
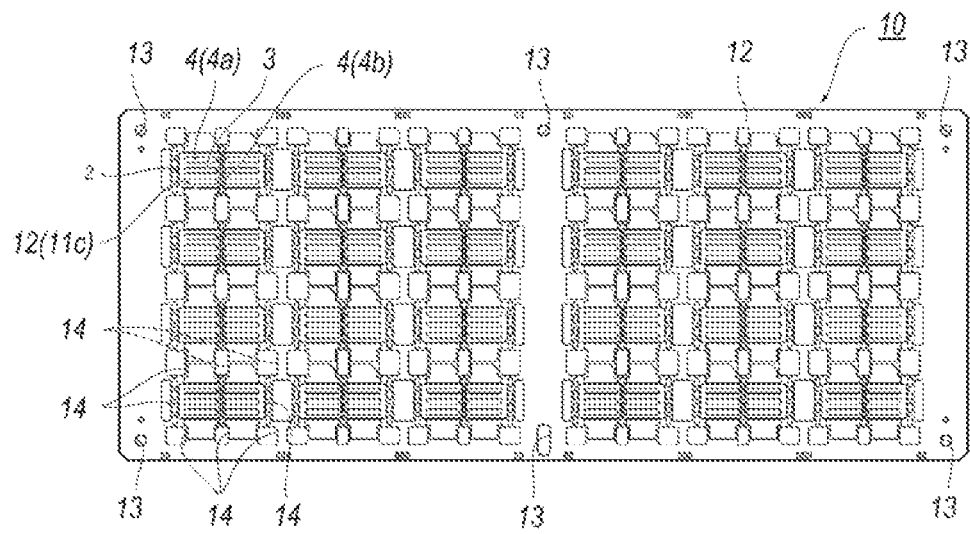

[Fig. 9]
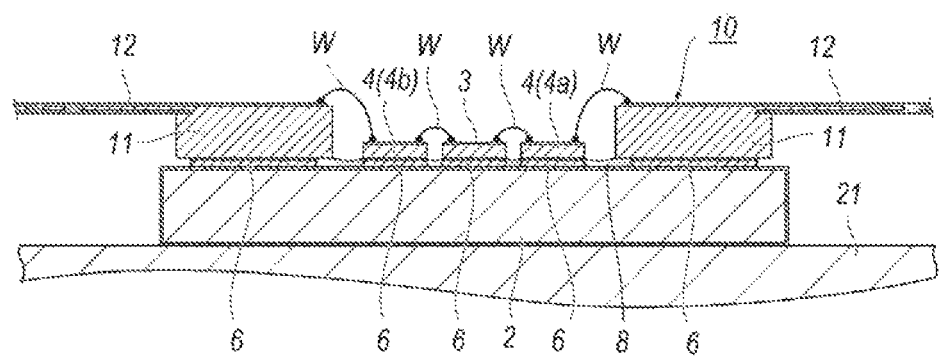

[Fig. 10A]
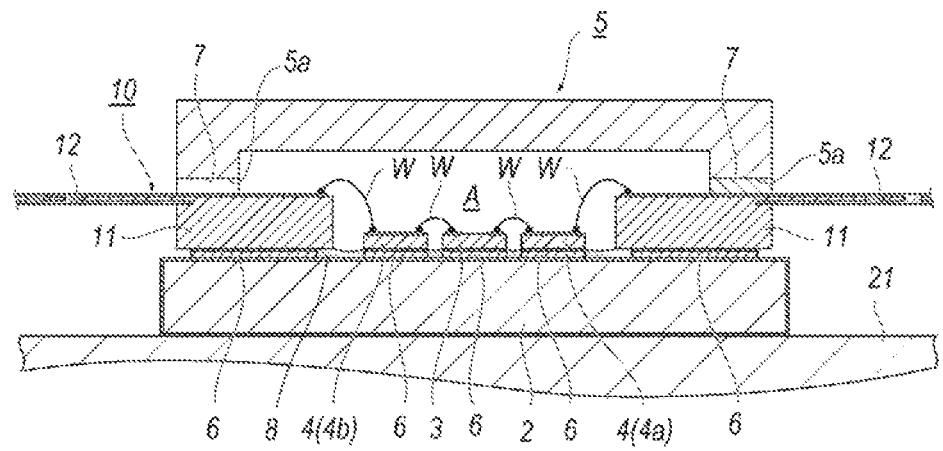
[Fig. 10B]
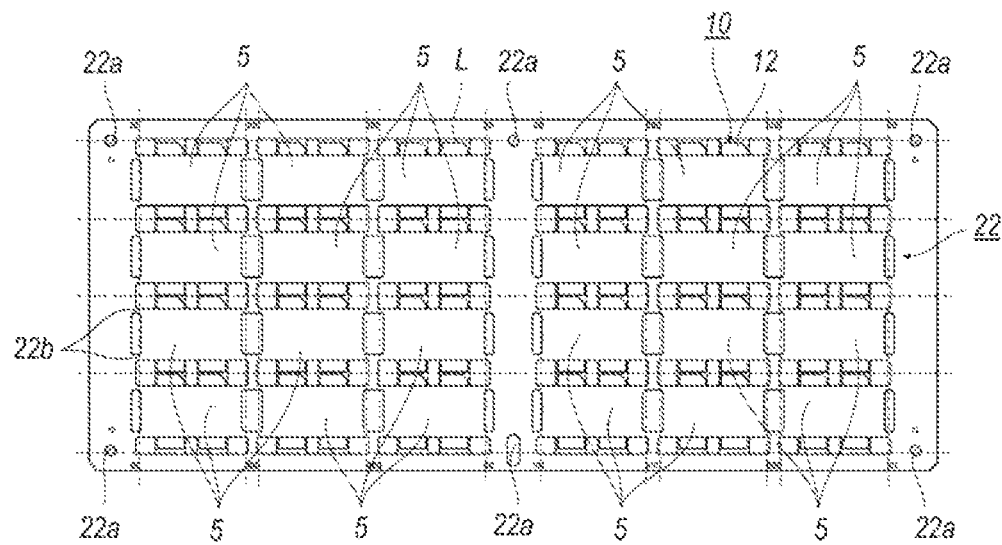

[Fig. 11A]
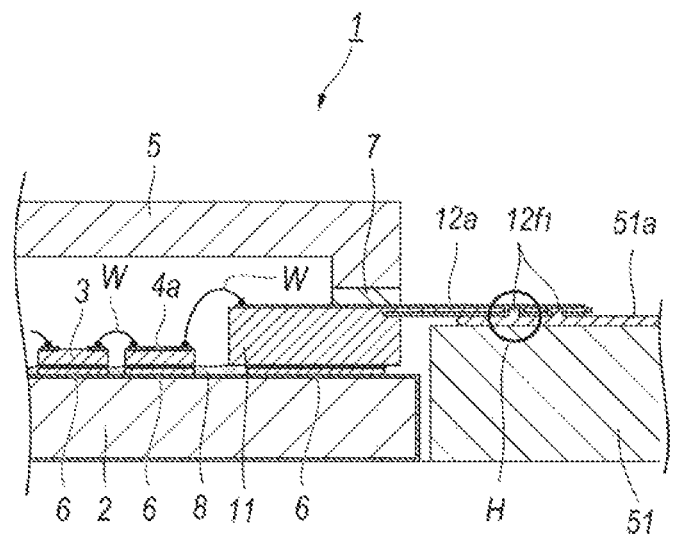
[Fig. 11B]
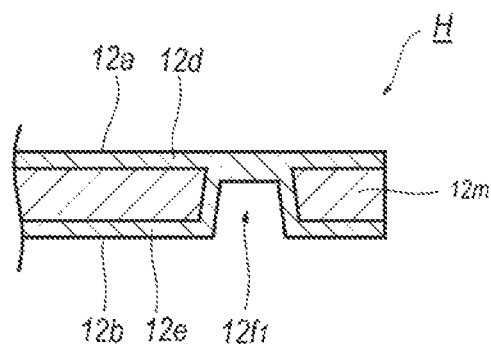

[Fig. 12A]
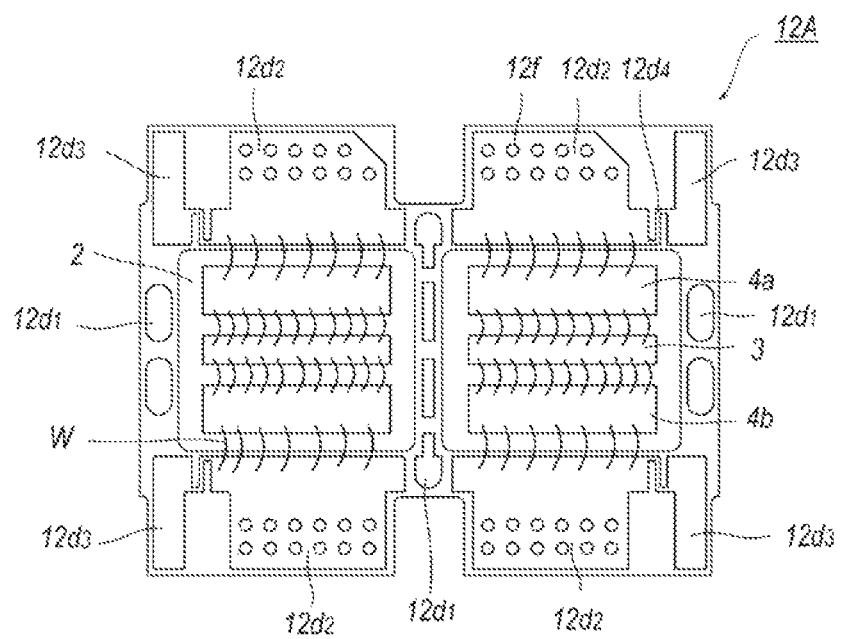
[Fig. 12B]
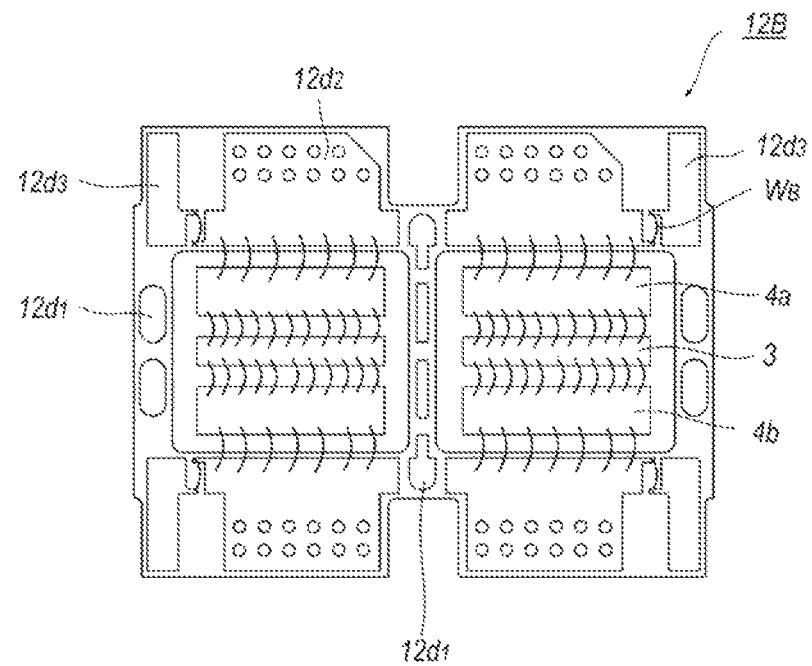

[Fig. 12C]
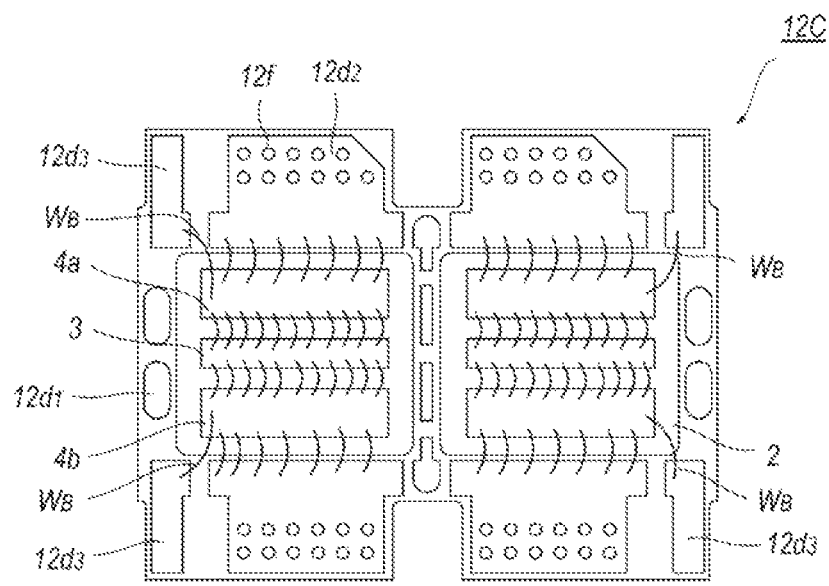
[Fig. 12D]
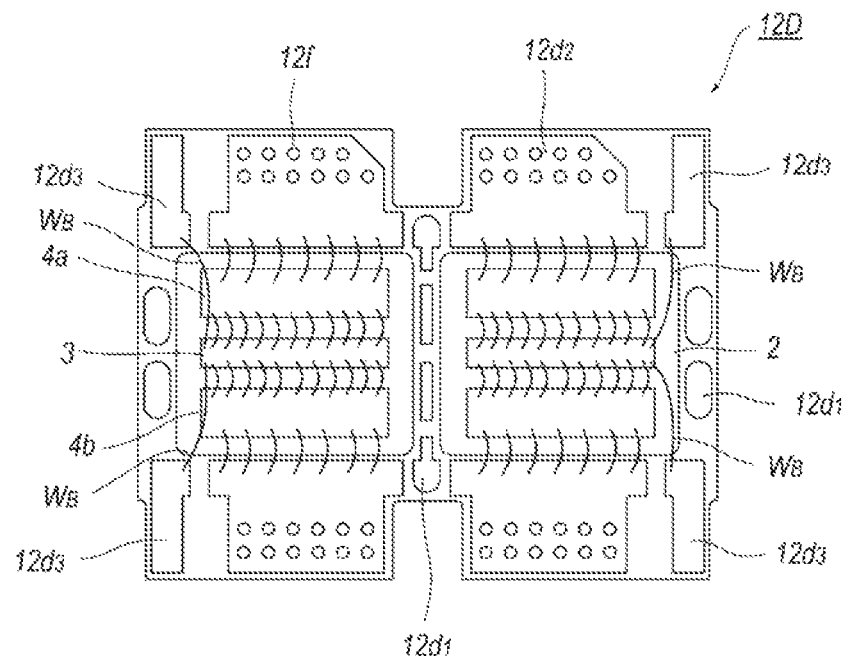

[Fig. 13]
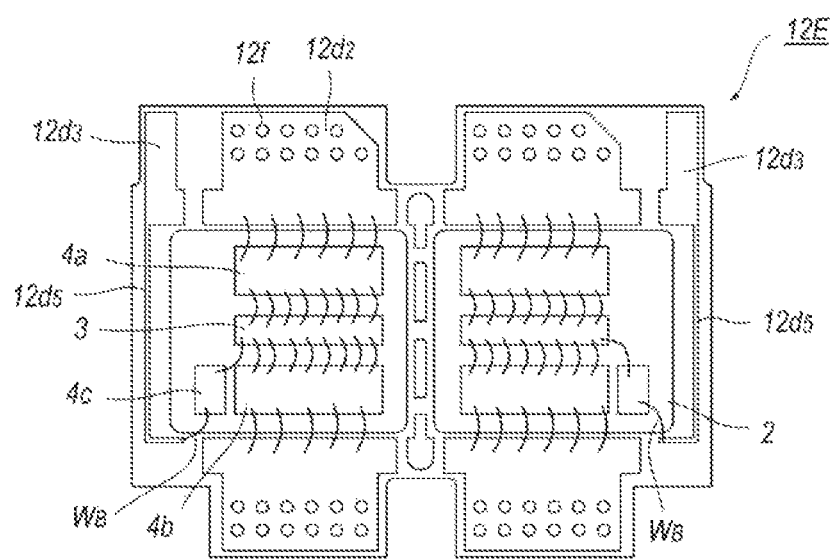

[Fig. 14A]
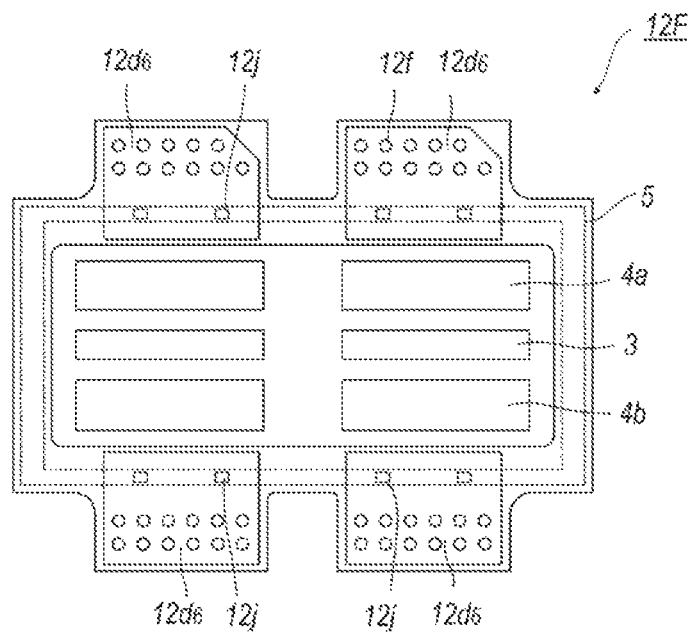
[Fig. 14B]
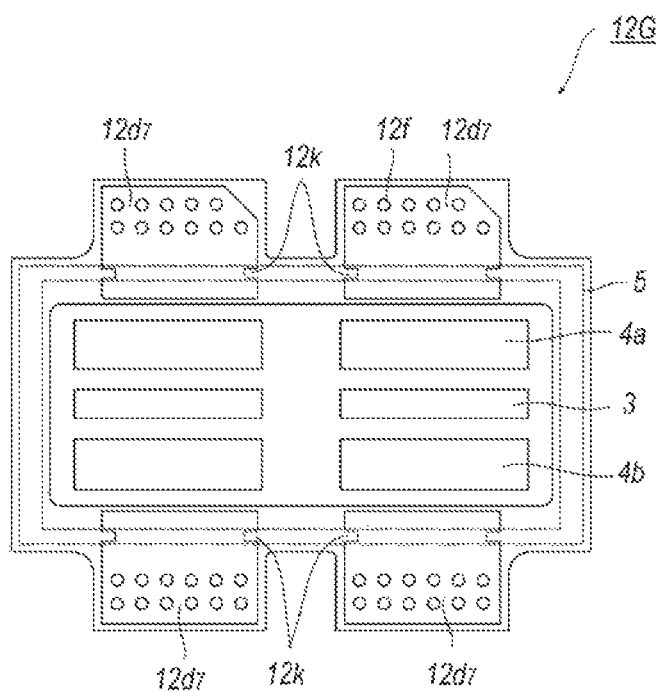

[Fig. 15]
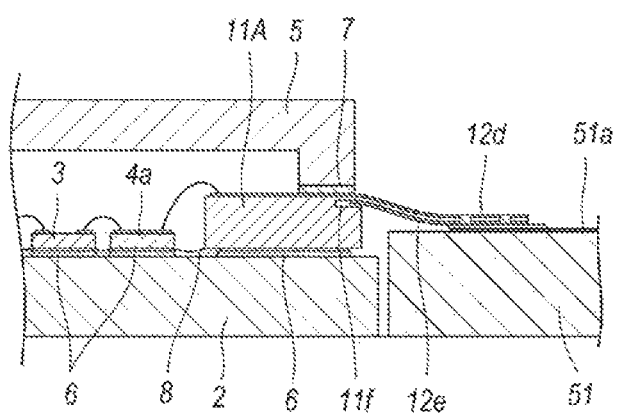

[Fig. 16A]
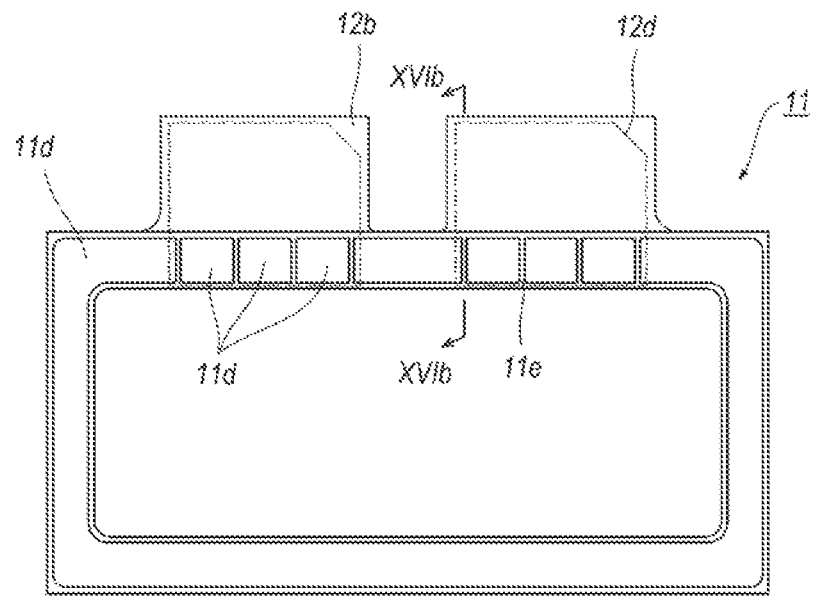
[Fig. 16B]
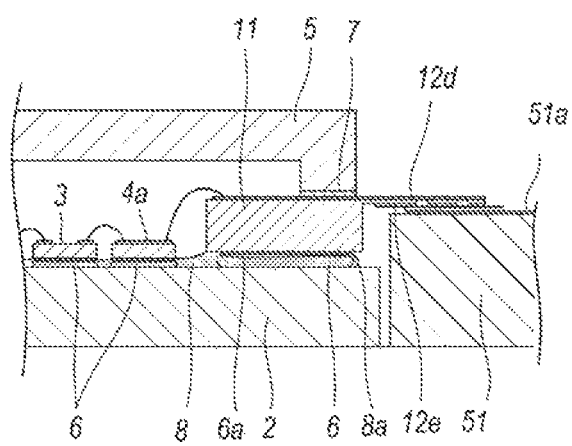

[Fig. 17A]
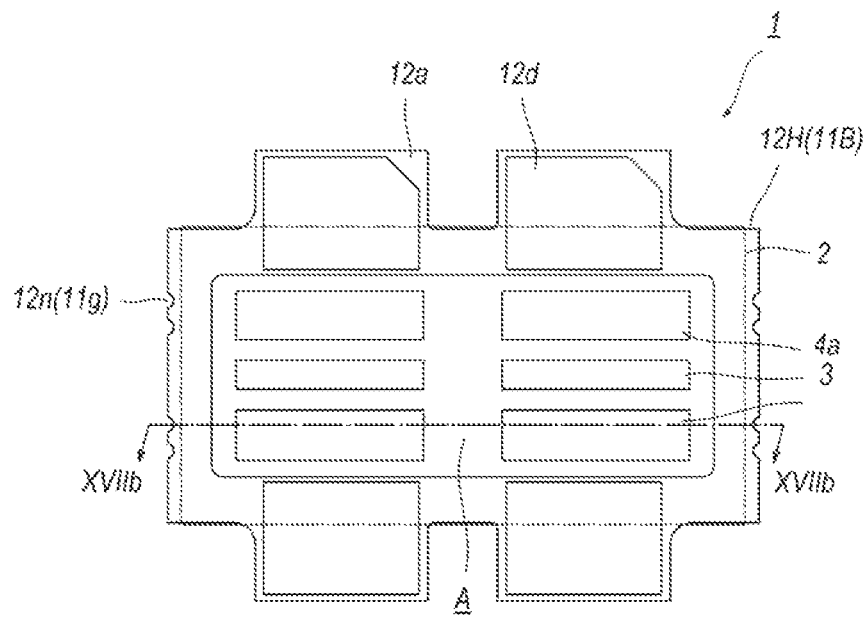
[Fig. 17B]
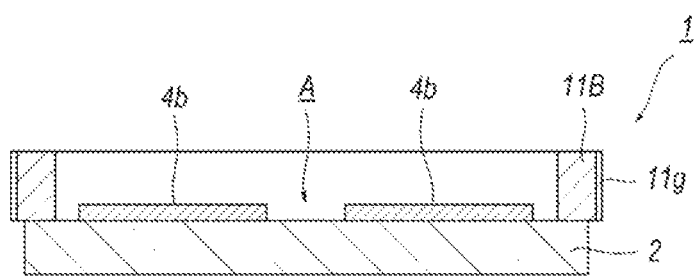

US 12,082,350 B2

SEMICONDUCTOR DEVICE

CROSS-REFERENCE TO OTHER APPLICATIONS

This application is a continuation of U.S. application Ser. No. 16/343,622 filed on Apr. 19, 2019 and claims the priority benefit of U.S. application Ser. No. 16/343,622 which is the U.S. national phase of PCT/JP2018/028924 filed on Aug. 2, 2018, and which claims the priority benefit of Japanese Application, JP2017-150035, filed on Aug. 2, 2017, the disclosures of which are hereby incorporated by reference in their entirety.

TECHNICAL FIELD

The present invention relates to a process of assembling a semiconductor device and relates to a semiconductor device assembled thereby.

BACKGROUND ART

A Japanese Patent Application laid open No. JP2011-165931A has disclosed a circuit module that provides the first printed circuit board (PCB) to mount electrical components operable in a radio frequency (RF) range and the second PCB disposed against the first PCB. The second PCB provides hollows into which the electrical components in the first PCB are set, where the hollows are surrounded by walls for forming via holes and conductive patterns formed on a top surface and/or inner surfaces thereof. Conductive patterns in the top surfaces of the first and second PCBs are attached and electrically connected to each other. The hollows in the second PCB receive the electrical components and electrically isolate to each other.

Another Japanese Patent application laid open No. JP2014-132651A has disclosed a package for an electrical device operable in microwave frequencies and higher power. The package disclosed therein provides a frame made of ceramics and a metal base made of at least one of copper (Cu), a composite containing copper and Diamond, and a composite containing aluminum (Al) and Diamond. The frame, to which a lead terminal is brazed, is hermetically attached to the meal base with metal powder type of low temperature sintering. A package for an RF device may be generally formed by a metal base, a ceramic frame with a lead terminal, and a ceramic lid. The ceramic frame is brazed to the metal base, and the lead terminal is brazed to the ceramic frame. Furthermore, the lid is brazed to the ceramic frame to enclose a semiconductor chip and circuit components each mounted on the metal base air-tightly. An RF device for a low noise and a small signal application sometimes provides a base made of ceramics instead of the metal base.

However, such a package for an RF device formed by the metal base, the ceramic frame, and the ceramic lid generally shows lesser cost merit. An RF device whose frame, sometimes accompanying with a lid, is substituted into one made of resin, such as glass epoxy, may show remarkable cost merit; but leaves subject in an assembly process thereof. That is, a resin made package may reduce material cost but leave assembly cost thereof in relatively high.

SUMMARY OF INVENTION

An aspect of the present invention relates to a process of assembling a semiconductor device is disclosed. The process includes steps of (a) arraying a plurality of metal bases on a carrier; applying sintered metal paste simultaneously onto the respective bases; (b) disposing a substrate simultaneously onto the sintered metal paste where the substrate includes side walls corresponding to the bases and a wiring layer common the bases; and (c) volatilizing solvent contained in the sintered metal paste.

An aspect of the present invention relates to a process of simultaneously assembling a plurality of semiconductor devices, each of the semiconductor devices including a metal base, a side wall, a wiring layer, and a lid. The process comprises steps of: (a) arraying a plurality of metal bases on a carrier; (b) applying sintered metal paste simultaneously onto the respective metal bases; (c) disposing a substrate that includes the side walls and the wiring layers simultaneously onto the sintered metal paste, where the wiring layers are continuous to the respective metal bases but the sides walls are independent of the respective metal bases; and (d) curing the sintered metal paste by volatilize solvents contained within the sintered metal paste.

BRIEF DESCRIPTION OF DRAWINGS

FIG. 1 shows a perspective view of a semiconductor device according to an embodiment of the present invention;

FIG. 2 is a plan view showing an inside of the semiconductor device;

FIG. 3 shows a side cross section of the semiconductor device;

FIG. 4A is a plan view showing a top surface of the wiring layer, and FIG. 4B is a plan view showing a back surface of the wiring layer;

FIG. 5A is a plan view of a bottom of the side wall viewing from the base, and FIG. 5B shows a cross section of the base, the side wall, and the sintered metal paste therebetween;

FIG. 6A shows a cross section of a carrier and the base, while, FIG. 6B is a plan view of the carrier mounting the bases in an array;

FIG. 7A shows a cross section of the base applying the sintered metal paste thereon, and FIG. 7B is a plan view of the bases disposed in the array on the carrier, where the bases each apply the sintered metal paste thereon;

FIG. 8A shows a cross section of the base fixing a substrate, a semiconductor chip, and circuit components thereof with the sintered metal paste, and FIG. 8B is a plan view of the bases each mounting the semiconductor chips, the circuit components, and the wiring layer through the side walls;

FIG. 9 shows a cross section of the base, the semiconductor chip, the circuit components, and the substrate where the semiconductor chip, the circuit components, and the substrate are wire-bonded to each other and the sintered metal paste is covered with covering resin;

FIG. 10A shows a cross section of the semiconductor device that assembles the lid through an adhesive sheet, and FIG. 10B is a plan view of the lids assembled on the respective side walls, where the lids are tied with a tie bar;

FIG. 11A shows a cross section of the semiconductor device that is assembled with an external circuit board, and FIG. 11B magnifies the wiring layer providing a via hole filled with a metal;

FIG. 12A to FIG. 12D show plan views of the wiring layers that are modified from the wiring layer shown in FIG. 4A;

FIG. 13 shows another wiring layer that is also modified from the wiring layer shown in FIG. 4A;

FIG. 14A and FIG. 14B are plan views of the wiring layers that compensate impedance, where the wiring layers are modified from the wiring layer shown in FIG. 4A;

FIG. 15 shows a cross section of the semiconductor device assembled with the external circuit board, where the semiconductor device provides a modified side wall that provides an undercut for moderating curvature of the wiring layer;

FIG. 16A shows a bottom view of a side wall that is modified from the side wall shown in FIG. 5A, and FIG. 16B shows a cross section of the modified side wall mounted on the base; and FIG. 17A is a plan view of a side wall that is also modified from the side wall shown in FIG. 5A, and FIG. 17B shows a cross section of the side wall and the base taken along the line XVIIb-XVIIb indicated in FIG. 17A.

DESCRIPTION OF EMBODIMENTS

Next, some embodiments according to the present invention will be described referring to accompanying drawings. In the description of the drawings, numerals or symbols same with or similar to each other will refer to elements same with or similar to each other without duplicating explanations.

FIG. 1 shows a perspective view of a semiconductor device 1 according to an embodiment of the present invention; and FIG. 2 is a plan view showing an inside of the semiconductor device 1. The semiconductor device 1 of the present embodiment includes a metal base 2, a semiconductor chip 3 mounted on the metal base 2, circuit components including an input matching unit 4a and an output matching unit 4b, a lid 5, and a substrate 10. The semiconductor chip 3 and the circuit components, 4a and 4b, are also mounted on the metal base 2. The substrate 10, which includes a side wall 11 and the wiring layer 12, defines a space A where the semiconductor chip 3 and the circuit components 4 are mounted on the metal base 2. The semiconductor device 1 of the present embodiment provides two semiconductor chips 3 that may be operable independently.

The metal base 2 may be made of, for instance, stacked metals of copper (Cu), an alloy of copper and molybdenum (CuMo), and another copper (Cu), which is often denoted as Cu/CuMo/Cu; a composite of copper and diamond, which is often denoted as Cu-Diamond; a composite of aluminum and diamond (Al-Diamond); a composite of copper and graphite (Cu-Graphite); a composite of aluminum and graphite (Al-Graphite); an alloy of copper and tungsten (CuW); an alloy of copper and molybdenum (CuMo); and a copper slab. Among those materials, the stacked metals of Cu/Mo/Cu, that of Cu/CuMo/Cu, and the Cu slab show preferable cost merits.

The metal base 2 has a rectangular plane shape with a dimension of 10×20 mm2 but sizes or areas thereof are optional for types and applications of the semiconductor device 1. The metal base 2, which preferably has a thickness of 0.5 to 1.5 mm, is plated with metals of nickel and gold (Ni—Au) with respective thicknesses of 3.0 and 1.5 μm; metals of nickel, palladium, and gold (Ni—Pd—Au) with respective thicknesses of 3.0, 0.2 and 0.3 μm, respectively; and/or metals of palladium and gold with respective thicknesses of 0.1 and 0.1 μm.

The substrate 10 is mounted on a peripheral area surrounding the space A, which will be called as the second area. The semiconductor device 1 mounts the semiconductor chip 3 and the circuit components 4 on the space A of the metal base 2. The input matching unit 4a, the semiconductor chip 3, and the output matching unit 4b are arranged in this order in the space A. The semiconductor chip 3 may provide a substrate made of, for instance, silicon (Si), silicon carbide (SiC), gallium nitride (GaN), gallium arsenide (GaAs), and/or diamond. The substrate of the semiconductor chip 3 provides a back metal in a back surface thereof facing the metal base 2.

The semiconductor chip 3 may be a type of high electron mobility transistor (HEMT) primarily made of GaN, where the HEMT made of primarily GaN may be operable at higher power. The semiconductor chip 3 has an elongated plane shape with an aspect ratio of 1 to 10. One example of the semiconductor chip 3 has dimensions of around 0.5 mm for a shorter side, around 8.0 mm for a longer side, and 50 to 200 μm for a thickness.

FIG. 3 shows a side cross section of the semiconductor device 1. As shown in FIG. 3, the semiconductor chip 3, the input and output matching units, 4a and 4b, are mounted on the metal base 2 interposing a sintered metal paste 6 therebetween. Respective bonding wires W electrically connect the wiring layer 12, the input matching unit 4a, the semiconductor chip 3, the output matching unit 4b, and another wiring layer 12 each other. The input and output matching units, 4a and 4b, may include capacitors with a type of a parallel plate, namely, a die capacitor.

The input matching unit 4a matches impedance viewing the semiconductor device 1 at the input lead terminal, namely, an interconnection on one of the wiring layers 12, with impedance viewing the semiconductor chip 3 at a gate thereof. The output matching unit 4b matches the impedance viewing the semiconductor device 1 at the output lead, namely, an interconnection on the other wiring layer 12, with the impedance viewing the semiconductor chip 3 at a drain thereof; specifically, the output matching unit 4b matches the impedance such that the semiconductor device 1 may show maximum efficiency for the output thereof and show designed frequency performance.

Disposed between the metal base 2 and the semiconductor chip 3, between the metal base 2 and the circuit components 4, and between the metal base 2 and the side wall 11 of the substrate 10 are the sintered metal paste 6. The sintered metal paste 6, which contains fine metal powders, may be hardened by sintering the powders, namely, curing solvent contained therein. The sintered metal paste 6 may soak metal powders of, for instance, silver (Ag), copper (Cu), nickel (Ni), aluminum (Al), palladium (Pd), zinc (Zn), and alloys thereof in a solvent that may be easily volatilized at a relatively lower temperature of 150 to 300° C. Thus, exposing the sintered metal paste 6 applied on the metal paste 6 under such a temperature, the solvent volatilizes as leaving only condensed metal powders.

The substrate 10 may be formed by impregnating at least one of, for instance, polyphenylene ether (PPE), liquid crystal polymer (LCP), hydrocarbon ceramics (HCC), and/or epoxy resin within a glass cloth. The substrate 10 includes a side wall 11 and a wiring layer 12 on a top of the side wall 11, where the wiring layer 12 mounts the lid thereon and provides interconnections 12 thereon. The side wall 11 and the wiring layer 12 are fixed to each other as interposing a prepreg therebetween. The lid 5, which may be formed also by solidifying a glass cloth containing at least one of PPE, LCP, poly-ether-ether-ketone (PEEK) and epoxy resin, has a rectangular plane shape whose peripheries are substantially aligned with peripheries of the side wall 11.

The side wall 11 preferably has a thickness of 0.2 to 1.0 mm, while the wiring layer 12 preferably has a thickness of 0.05 to 0.2 mm. The semiconductor device 1 of the present embodiment provides the side wall 11 and the wiring layer 12 with thicknesses of 0.5 mm and 0.1 mm, respectively. The wiring layer 12 provides interconnections in both of a top surface 12a and a back surface 12b thereof for inputting and extracting radio frequency (RF) signals. The wiring layer 12 in an input side has a cut corner thereby distinguish the input wiring layer 12 from the output wiring layer 12.

FIG. 4A and FIG. 4B are plan views showing the wiring layer 12, exactly, the top surface 12a and the back surface 12b thereof, respectively; while, FIG. 5A is a plan view of the side wall 11, exactly, a bottom surface thereof viewing from the base 2 and FIG. 5B shows a cross section of the base 2, the side wall 11, and the sintered metal paste 6 therebetween. The side wall 11 and the wiring layer 12 provide openings, 11c and 12c, respectively, corresponding to the space A. Referring to FIG. 4A and FIG. 4B, the wiring layer 12 provides a framework 12g and a center partition 12h that form two openings 12c. The top surface 12a of the wiring layer 12 provides top metal patterns 12d in the framework 12g and the center partition 12h. Portions of the framework 12g and the center partition 12h provides the first type of the metal patterns $12d_1$, while, the other portions of the framework 12g intersecting the center partition 12h provides the second type of top metal patterns $12d_2$, where the former metal patterns $12d_1$ are provided for attaching the lid 5 thereto; while, the latter metal patterns $12d_2$ operate as signal terminals. The former metal patterns $12d_1$ are physically isolated from each other. Referring to FIG. 4B, the back surface 12b of the wiring layer 12 provides metal patterns 12e corresponding to the top metal patterns $12d_2$ in areas outside of the framework 12g. The metal patterns 12e in the back surface 12b are electrically connected with top metal patterns $12d_2$ in the top surface 12a through via holes 12f that are filled with metals.

Referring to FIG. 5A, the side wall 11 includes a framework 11g and a center partition 11h that form two openings 11c, where the framework 11g, the center partition 11h, and the openings 11c reflect the framework 12g, the center partition 12h, and the openings 12c in the wiring layer 12. The framework 11g and the center partition 11h also provides metal patterns 11d for fixing the metal base 2 thereto. The sintered metal paste 6 is to be applied onto the metal patterns 11d. The metal patterns 11d in the side wall 11 are physically isolated from each other and electrically from the top metal patterns 12d in the top surface 12a of the wiring layer 12, which may suppress mechanical stresses, warping, and/or peel off of the wiring layer 12 from the side wall 11 due to a difference in thermal expansion coefficients therebetween.

Next, a process of assembling the semiconductor device 1 according to an embodiment of the present invention will be described. The process of the present embodiment has a feature that a plurality of the semiconductor devices 1 is assembled collectively and simultaneously. First, as shown in FIG. 6A and FIG. 6B, the process prepares a carrier 21, where FIG. 6A shows a cross section of the carrier 21 mounting the metal base 2 and FIG. 6B is a plan view showing the carrier 21 and the metal bases 2, where FIG. 6A magnifies only one base 2 mounted on the carrier 21, but, the carrier 21 may mount a plurality of metal bases 2 in an array, where the carrier 21 shown in FIG. 6B mounts 6×4=24 bases 2 thereon. The carrier 21 may be made of metal and/or ceramics as far as the carrier 21 may have heat resistance at a treatment subsequently performed in the process, which will be described later. The process mounts the bases 2 on the carrier 21 in the array. The carrier 21 provides alignment holes 21a to align parts to be mounted on the carrier 21. At least one of alignment holes 21a has an elongated circular shape.

Next, as shown in FIG. 7A and FIG. 7B, the process applies the sintered metal paste 6 onto portions of the metal bases 2 by the screen printing simultaneously for the respective metal bases 2, where the areas applied with the sintered metal paste 6 are those for the substrate 10, the semiconductor chip 3 and the circuit components 4 to be mounted on the metal bases 2. Specifically, a mask that provides openings corresponding to the areas to be applied with the sintered metal paste 6 is first placed on the metal bases 2 arranged in the array. The mask provides holes aligned with the alignment holes 21a in the carrier 21. Aligning the holes in the mask with the alignment holes 21a in the carrier 21, the mask in positions thereof may be precisely aligned with the metal bases 2. Applying the sintered metal paste 6 onto the bases 2 through the mask and smoothing the applied paste by a spatula, squeegee, or the like; then removing the mask from the carrier 21; the bases 2 are simultaneously applied with the sintered metal paste 6 as shown in FIG. 7B.

Simultaneous application may not only save the application procedures but make the applied metal paste 6 uniform. A conventional technique where the bases 2 are applied with the sintered metal paste 6 one by one takes a tact time of, for instance, a few scores of seconds. While, the method according to the present embodiment takes a process time of about two and half seconds for applying the sintered metal paste 6, which means almost one minute (60 seconds) for 24 bases; that is, the tact time becomes almost ⅛ of the conventional technique.

The semiconductor chip 3, the circuit components 4, and the side wall 11 of the substrate 10 may be applied with one type of the sintered metal paste 6 in the present embodiment. However, adequate thicknesses of the sintered metal paste 6 for the respecting components sometimes become different from each other. In such a case, an additional technique such as the mask has thicknesses corresponding to the areas for the semiconductor chip 3, the circuit components 4, the side wall 11, and so on. That is, the mask has the respective openings with different depths corresponding to the semiconductor chip 3, the components 4, the substrate 10, and so on.

Then, the process places the semiconductor chip 3, the circuit components 4, and the substrate 10 onto the metal base 2. The wiring layer 12 is attached to the side wall 11 to form the substrate 10 in advance to mount the substrate 10 onto the metal base 2. The substrate 10, as shown in FIG. 8B, provides a plurality of units each corresponding to one base 2 and one side wall 11, namely, one semiconductor device 1, where the respective units are surrounded by rectangular holes 14. Also, the substrate 10 provides alignment holes 13 and dividing holes 14, where the former holes 13 are aligned with the alignment holes 21a in the carrier 21; while, the latter holes 14 are prepared for dividing respective units.

Aligning the holes 13 on the substrate 10 with the alignment holes 21a in the carrier 21, the substrate 10 with the side wall 11 may be aligned with the metal base 2, which also aligns the substrate 10 with the semiconductor chip 3 and the circuit components 4 mounted on the metal base 2, without causing damages on the semiconductor chip 3 and the circuit components 4.

Then, an assembly including the carrier 21, the bases 2, and the substrates 10 shown in FIG. 8A and FIG. 8B is heat treated to volatilize a solvent contained in the sintered metal paste 6. Specifically, hating the assembly for about, for instance, two (2) hours at 200° C., the solvent contained in the sintered metal paste 6 is fully volatilized to leave only metals, which fixes the semiconductor chip 3, the circuit components 4, and the substrate 10 to the metal base 2. Conditions of the heat treatment are not restricted to those described above and those fully volatilizing the solvent but not deteriorating the left metals may be acceptable.

Referring to FIG. 5A and FIG. 5B again, the side wall 11 in the substrate 10 provides metal patterns 11d in the back surface thereof facing the metal base 2. The sintered metal paste 6 in portions within the gaps 11e between the back metal patterns 11d may be applied thick; while, that applied onto the back metal patterns 11d become thin. The sintered metal paste 6 applied thinner shows lesser adhesion strength between the metal base 2 and the side wall 11; but that applied within the gaps 11e may compensate the insufficient strength. Because the back metal layers 11d have a thickness of a few scores of micron meters, specifically, 30 to 50 μm, the sintered metal paste 6 applied within the gaps 11e is thicker than that applied onto the back metal layer 11d with a thickness less than 20 μm at least by the thickness of the back metal layer 11d.

Referring to FIG. 9, the process carries out the wire-bonding between the substrate 10, exactly, the top metal patterns $12d_2$ on the wiring layer 12, the circuit components 4, and the semiconductor chip 3. Specifically, bonding wires W connect the top metal pattern $12d_2$ with the input matching circuit 4a, the input matching circuit 4a with the semiconductor chip 3, the semiconductor chip 3 with the output matching circuit 4b, and the output matching circuit 4b with the metal pattern $12d_2$. The wire-bonding is independently carried out for the respective units assembled on the carrier 21.

A process of the wire-bonding generally requests to define the reference position for a plurality of bonding wires. Specifically, registering the reference position, two positions may be wire-bonded with one bonding wire. When the respective metal bases 2 are independently prepared like a conventional process, the wire-bonding is necessary to register the reference position for the respective bases independently. The process according to the present embodiment, only one reference position is defined for the respective metal bases 2, and a plurality of the bonding wires W for a plurality of the units may be wire-bonded as referring to the reference position common to the units. Thus, the process of the wire-bonding may be simplified and effectively save the tact time.

After the wire-bonding, the sintered metal paste 6, which is cured by the heat treatment, is overlaid with a resin film 8. Specifically, a resin is dripped so as to cover the sintered metal paste 6, then, heat-treated at around 150° C. for a several scores of minutes to volatilize solvent contained in the resin. Because the present semiconductor device 1 has the side wall 11 made of, for instance, glass epoxy resin or the like, which shows no barriers for invading moisture into the space A. When the lid 5 is also made of resin, the invasion of the moisture is further enhanced. In addition, the sintered metal paste contains silver (Ag), which is easily ionized to positive ions (Ag$^+$) by the existence of the water, namely, the moisture, and the semiconductor chip 3 in the gate thereof is often negatively biased. Thus, the ionized silver Ag$^+$ may be drawn toward the gate electrode of the semiconductor chip 3 as creeping a side of the semiconductor chip 3, which finally makes a short-circuit of the gate electrode to the ground, which is often called as the Ag migration in the technical field of the semiconductor device and the semiconductor process. Accordingly, the semiconductor device 1 of the present embodiment covers the volatilized sintered metal paste 6 with the resin film 8, as shown in FIG. 9. The resin film 8 may have a thickness of several scores of micron meters.

After curing the overlaid resin 8, the process attaches lids 5 to the respective units, where the units are disposed in the array on the carrier 21 and have the side walls 11, as shown in FIG. 10A and FIG. 10B. The lids 5, as shown in FIG. 10B, are tied with the tie bar 22 that has holes 22a aligned with the alignment holes 21a in the carrier 21. Thus, aligning the holes 22a with the alignment holes 21a, each of the lids 5 may be precisely attached to the respective side walls 11.

Specifically, attaching an adhesive sheet 7 in bottoms 5a of the lids 5 in advance to the attachment to the substrate 10, and placing the lids 5 onto the substrate 10 as aligning the holes 22a with the alignment holes 21a, the process carries out heat treatment of the units with the lids 5 at 150° C. as pushing the lids 5 against the substrate 10. The attachment of the lids 5, combined with the base 2 and the side wall 11, may enclose the space A, exactly, two spaces A in one side wall 11. Finally, cutting bridges 22b that support the lids 5 from the tie bar 22 along the lines L that connect the holes 14 provided in the wiring layer 12 shown in FIG. 8B, and de-attaching the metal bases 2 from the carrier 21, a plurality of semiconductor devices 1 shown in FIG. 1 may be assembled simultaneously.

The process of forming the semiconductor device 1 according to the present embodiment first disposes a plurality of the metal bases 2 in an array on the carrier 21, then, applies the sintered metal paste 6 on the metal bases 2 at the same time by the screen printing. Also, the metal bases 2 that mount the respective semiconductor chips 3, the circuit components 4, and the substrate 10 thereon are heat treated collectively to volatilize the solvent containing in the sintered metal paste 6. Accordingly, the tact time may be drastically shortened. Still further, because the semiconductor device 1 may have the side wall 11 made of resin material, for instance, epoxy resin containing glass and so on, which may effectively reduce material costs of the semiconductor device 1 compared with a case where the side wall is made of ceramics.

First Modification

Next, some modifications of components implemented within the semiconductor device 1 will be described. FIG. 11A shows a cross section of the semiconductor device 1 that is assembled with an external circuit board, and FIG. 11B magnifies the wiring layer 12 in a portion H around the via hole $12f_1$ that is filled with a metal. The wiring layer 12 shown in FIG. 11A has a feature that the via hole $12f_1$ is not pierced from the back surface 12b to the top surface 12a, that is the metal patterns, 12d and 12e, cover the via hole $12f_1$. The wiring layer 12 in a portion outside of the side wall 11 comprises a support member 12m sandwiched by the top metal pattern 12d and the back metal pattern 12e, where the support member 12m may be made of materials substantially same with those of the side wall 11. As shown in FIG. 11A, the semiconductor device 1 is assembled with an external circuit board 51 that provides an interconnection 51a thereon. The wiring layer 12 is soldered with the interconnection 51a such that the back metal pattern 12d is attached to the interconnection 51a. When the via hole $12f_1$ has an opening, melted solder on the interconnection 51a may overflow onto the top metal pattern 12d passing the via hole $12f_1$. The wiring layer 12 of the present embodiment has the via holes $12f_1$ covered with at least one of the top metal pattern 12d and the back metal pattern 12e, or preferably, fully filled with a metal.

Second Modification

FIG. 12A to FIG. 12E show plan views of wiring layers, 12A to 12D, that are modified from the wiring layer 12 shown in FIG. 4A, where the modified wiring layers, 12A to 12D, provide bias pads $12d_3$ for supplying a gate bias and a drain bias to the semiconductor chip 3.

Specifically, when the semiconductor chip 3 installed within the semiconductor device 1 has a type of field effect transistor (FET), a gate bias and a drain bias are inevitable to operate the semiconductor chip 3. The source of the semiconductor chip 3 is directly grounded through the metal base 2. Although the gate bias and the drain bias may be supplied through the metal patterns $12d_2$ for the RF signal, additional circuit components become necessary outside of the semiconductor device 1. The semiconductor chip 3 may be supplied with the gate biases through the bias pads $12d_3$ and elongated patterns $12d_4$ from the bias pads $12d_3$ to the top metal patterns $12d_2$, where those metal patterns, $12d_2$ to $12d_4$, are each arranged in an upper side in FIG. 12A. The elongated patterns $12d_4$ show inductive performance for an RF signal amplified by the semiconductor chip 3. Accordingly, the RF signals supplied to the top metal patterns $12d_2$ may be substantially free from the bias pads $12d_3$. That is, the elongated metal patterns $12d_4$ show substantial impedance at a frequency of the RF signal, the bias pads $12d_3$ may be substantially isolated from the top metal patterns $12d_2$ at frequencies around that of the RF signal. A situation same with those above described may be applicable to the drain biases. The semiconductor chip 3 may be supplied with the drain biases through the bias pads $12d_3$ and the elongated metal patterns $12d_4$ each arranged in a lower side in FIG. 12A. The bias pads $12d_3$ in the lower side may be substantially isolated from the RF signal output from the semiconductor chip 3 and carried on the top metal patterns $12d_2$ in the lower side. Thus, the semiconductor chip 3 may be biased without interposing any circuit components on the signal line, namely, the top metal patterns $12d_2$.

FIG. 12B shows another modifier arrangement of the wiring layer 12 shown in FIG. 4A. The modified wiring layer 12B has a feature that the gate biases and the drain biases are supplied through the bias pads $12d_3$ arranged in respective corners of the wiring layer 12B but through bonding wires $W_B$ from the bias pads $12d_3$ to the top metal patterns $12d_2$ substituting for the elongated metal patterns $12d_4$ in the former modification. The bonding wire $W_B$, which may be made of metal, typically, gold (Au) with a diameter of around a few scores of micron-meters, generally have inductance of several nan-henry, which may cause substantial impedance around frequencies subject to the semiconductor device 1.

FIG. 12C shows still another modification of the wiring layer 12C, which has a feature that the bias pads $12d_3$ are wire-bonded with the input matching unit 4a and the output matching unit 4b. Because the bonding wires $W_B$ have respective lengths longer than those implemented in FIG. 12B, and connected directly with the matching units, 4a and 4b, bypassing the top metal patterns $12d_2$. Accordingly, the bonding wires $W_B$ may show further substantial impedance at the frequencies around the frequency subject to the semiconductor device 1, and the signal lines out of the semiconductor device 1 may be further isolated from the bias lines.

FIG. 12D shows still another modification of the wiring layer 12D, where the wiring layer 12D has a feature that the gate bias and the drain bias of the semiconductor chip 3 are provided directly from the bias pads $12d_3$ through the bonding wires $W_B$ bypassing the top metal patterns $12d_2$ and the input matching unit 4a. That is, the semiconductor chip 3 may provide an additional gate pad that is connected with other gate pads within the semiconductor chip 3, which are wire-bonded to the input matching unit 4a, and wire-bonded with the bias pad $12d_3$ through the bonding wire $W_B$. The semiconductor chip 3 may also provide an additional drain pad that is connected with the other drain pads within the semiconductor chip 3, which wire-bonded with the bias pad $12d_3$ with the bonding wire $W_B$. According to the modified arrangement of the wiring layer 12D, the bonding wires $W_B$ may be further elongated compared with those appearing in FIG. 12C and connected directly with the semiconductor chip 3 bypassing the top metal patterns $12d_2$ and the matching units, 4a and 4b. The isolation between the top metal patterns $12d_2$, namely, the signal lines, and the bias pads $12d_3$ may be effectively enhanced.

FIG. 13 is a plan view showing still another modified wiring layer 12E. The wiring layer 12E has a feature to provide only the bias pad $12d_3$ for the drain bias; while, the gate bias for the semiconductor chip 3 is supplied outside of the semiconductor device 1 through the top metal pattern $12d_2$ connected to the gate of the semiconductor chip 3. The semiconductor chip 3 may receive the drain bias through the bias pad $12d_3$, an elongated pattern $12d_5$, and a relay circuit 4c. The elongated pattern $12d_5$, which runs on the wiring layer 12E from a gate side to a drain side under the lid 5, is wire-bonded with the relay circuit 4c through the bonding wire $W_B$. The relay circuit 4c, which may be a die capacitor with a top electrode and a back electrode that is directly grounded to the metal base 2, is wire-bonded with the gate pad provided on the semiconductor chip 3. Thus, the relay circuit 4c may operate as a bypassing capacitor mounted next to the semiconductor chip 3, which may stabilize the drain bias.

Third Modification

FIG. 14A and FIG. 14B are plan views of wiring layers, 12F and 12G, also modified from the wiring layer 12 shown in FIG. 4A according to the third modification of the present invention, where the wiring layers, 12F and 12G, provide functions for compensating impedance variation. That is, the top metal layers, $12d_6$ and $12d_7$, operating as lead terminals for inputting and outputting the RF signal, respectively, preferably have substantially uniform impedance from an outer end to an inner end that faces to and closer to the input matching unit 4a and the output matching unit 4b. However, the lid 5 inevitably covers or overlaps with only a portion of the top metal layers, $12d_6$ and $12d_7$. Such a portion overlapping with the lid 5 disarranges the impedance of the top metal layers, $12d_6$ and $12d_7$. The wiring layers, 12F and 12G, shown in FIG. 14A and FIG. 14B, respectively, may compensate this disarrangement or variation in the impedance. In FIG. 14A and FIG. 14B, the wiring layers, 12F and 12G, and the side wall 11 not explicitly illustrated therein remove the center partitions, 11c and 12c.

Because the lid 5 has the dielectric constant different from that of air, for instance, the lid 5 has the dielectric constant of around 4.0 even when the lid 5 is made of resin; while, the air has the dielectric constant of unity, the impedance of the portion of the top metal layers, 12 to 12G, overlapping with the lid 5 becomes different from that of other portions exposed to the air. For instance, when the side wall 11 under the wiring layers, 12 to 12G, is made of glass epoxy resin whose dielectric constant is around 4.1 and has a thickness of 0.6 mm, the lid 5 is made of resin whose dielectric constant is also around 4.1, the top metal layers, 12 to 12G, has a thickness about 55 μm and a width of 6 mm, the equivalent impedance of the top metal layers, 12 to 12G, in the portion overlapping with the lid 5 becomes 14.1Ω, while, the rest portion exposing to the air and not overlapped with the lid 5, has the equivalent impedance of 15.1Ω, which is different by 1Ω from that of the former portion. In order to compensate this variation in the impedance, the top metal layers, 12 to 12G, are necessary to be narrowed to 5.5 mm. When the lid 5 is made of ceramics, the dielectric constant thereof exceeds 9.5, the variation in the impedance of the top metal layers, 12 to 12G, becomes wider. Even only 1Ω difference causes degradation in a transmission characteristic of the RF signal carried on the top metal layers, 12 to 12G.

One solution for compensating the variation in the impedance is to form the portion of the top metal layers, 12 to 12G, overlapping with the lid 5 narrower. However, the top metal layers, 12 to 12G, are necessary to have a width substantially equal to that of the semiconductor chip 3 because, when both widths are different from each other, bonding wires connecting the top metal layers, 12 to 12F, with the semiconductor chip 3 are necessary to compensate the discrepancy in the widths, which may cause phase shifts between an RF signal provided to a center portion and those provided to peripheral portions of the semiconductor chip 3. Accordingly, the top metal layers, 12 to 12G, are required to have the width substantially equal to that of the semiconductor chip 3.

The arrangements of the top metal layers, 12F and 12G, shown in FIG. 14A and FIG. 14B may give a solution for a dilemma above described. That is, the top metal layers, $12d_6$ and $12d_7$, equivalently narrows the widths thereof in the portion overlapping with the lid 5. The top metal layer $12d_6$ has a plurality of openings 12j, while, the other top metal layer $12d_7$ has cuts 12k. The wiring layer 12F shown in FIG. 14A provides the top metal layers $12d_6$ each having a width of 6 mm and two openings 12j with a width of 0.25 mm, which means that a metal covering ratio in a center portion between the two openings becomes 87.5%, while, that in the side portions becomes 93.4%. Narrowing the width of the openings 12j and increasing the counts of the openings 12j, the difference between the metal covering ratios may reduce; but a minimum width of the openings 12j is limited to be around 0.1 mm because of accuracy in the etching of the top metal patterns $12d_6$.

The other wiring layer 12G shown in FIG. 14B, which has the two cuts 12k each having a width of 0.25 mm in the respective sides of the top metal layer $12d_7$, has the metal covering ratio of 100% in the center portion thereof; while the metal covering ratio of 87.5% in the side portions. This discrepancy in the metal covering ratio makes the impedance viewed from the center portion of the semiconductor chip 3 slightly different from the impedance viewed by the peripheral portions thereof. Thus, from a viewpoint of the precise impedance matching between the semiconductor chip 3 and the outside thereof, the arrangement of the top metal layer $12d_5$ shown in FIG. 5A and FIG. 5B becomes preferable.

Fourth Modification

FIG. 15 shows a cross section showing another semiconductor device that provides a side wall 11A modified from the side wall 11 shown in FIG. 3. The semiconductor device 1 is to be assembled with an external circuit board 51, exactly, the RF signal subject to the semiconductor device 1 is input to the semiconductor chip 3 through a transmission line 51a provided on the external circuit board 51, the top metal layer 12d as the input terminal, and the input matching unit 4a. The top metal layer 12d, namely, the input terminal, is generally leveled with a top surface of the external circuit board 51 where the transmission line 51a is provided, as shown in FIG. 11A. However, the external circuit board 51 in the top surface thereof sometimes has a level different from that of the input terminal 12d. Also, the external circuit board 51 is often requested to be assembled with the semiconductor device 1 close as possible as shown in FIG. 15. In such an arrangement, the wiring layer 12 is forced to be bent abruptly, which sometimes breaks a root portion of the wiring layer 12. The modified arrangement of the side wall 11A provides an undercut 11f corresponding to the root of the wiring layer 12. The undercut 11f enables the wiring layer 12 to be bent moderately. That is, the interconnection 51a in an end thereof facing the semiconductor device 1 is retreated by, for instance, about 0.5 mm from an edge of the external circuit board 51. When the undercut 11f has a depth of, for instance, 0.2 mm from an edge of the side wall 11A, a length of the wiring layer 12 able to be bent may be expanded more than 30%. Accordingly, a stress induced in the wiring layer 12 may be suppressed and the wiring layer 12 may enhance flexibility against breakage.

Fifth Modification

The process according to the present embodiment drips the resin onto the sintered metal paste 6 after volatilizing the solvent contained therein in order to prevent the silver ions ($Ag^+$) from causing the migration drawn to the gate pad of the semiconductor chip 3. The fifth modification of the semiconductor device 1 shown in FIG. 16A and FIG. 16B has an arrangement that may suppress or prevent silver ions $Ag^+$ put between the side wall 11 and the metal base 2 from being drawn toward the back metal layer 12e of the wiring layer 12. FIG. 16A is a plan view showing a back surface of the side wall 11, and FIG. 16B shows a cross section taken along the line XVIb-XVIb indicated in FIG. 16A. Because the back metal pattern 12e connected to the gate pad of the semiconductor chip 3 is negatively biased, the silver (Ag) contained in the sintered metal paste 6 may be positively ionized by moisture in air and occasionally drawn to the back metal layer 12e, which may cause the short-circuit of the gate electrode to the ground. The modified process of the present embodiment intentionally forms pin holes 6a in the sintered metal paste 6 under the side wall 11. The dripped resin 8a may leak from the space A externally through the pin holes 6a and effectively covers the sintered metal paste 6 oozed outwardly on the metal base 2 as shown in FIG. 16B. Thus, because the sintered metal paste 6 is covered with the dripped resin 8a even in the outside of the space A, the migration of the silver ions ($Ag^+$) with the back metal layer 12e in the wiring layer 12 may be effectively prevented.

The back metal patterns 11d have no gaps 11e except for portions corresponding to the input lead terminals; that is, the meshed back metal patterns 11d are provided only in the portion of the input lead terminals. Referring to FIG. 5B, because the sintered metal paste 6 in a thickness thereof becomes thin on the back metal patterns 11d, the process in the present modification uses a spacer between the metal bases 2 and the side walls 11 at the process for fixing the sides walls 11 to the respective metal bases 2 shown in FIG. 8B. Specifically, after the sintered metal paste 6 is applied on the metal bases 2, the substrate 10 is placed onto the metal bases 2 such that a space of 40 to 60 μm is secured between the metal bases 2 and the back metal layers 11d in the side walls 11, which means a space of about 80 to 100 μm is left between the metal base 2 and the side wall 11 in the gaps 11e. Thus, placing the substrate 10 onto the base putting the sintered metal paste 6 therebetween, the gaps 11e effectively leave portions unfilled with the sintered metal paste 6, which becomes pin holes 6a after the heat-treatment of the sintered metal paste 6. Dripping the overlaid resin 8 in the space A so as to cover the sintered metal paste 6, the overlaid resin 8a may easily ooze out through the pin holes 6a and cover the sintered metal paste 6 spreading outwardly under the side wall 11.

Sixth Modification

FIG. 17A is a plan view showing the semiconductor device 1 and FIG. 17B shows a cross section taken along the line XVIIb-XVIIb indicated in FIG. 17A. The semiconductor device 1 shown in FIG. 17A and FIG. 17B has a feature that the metal base 2 thereof has a lateral width along a direction connecting the two top metal layers 12d that are operable as the input lead terminals, which is shorter than a lateral width of the side wall 11B and the wiring layer 12H; while, a longitudinal width of the metal base 2 along a direction connecting the input lead terminal 12d with the output lead terminal, which is substantially equal to or slightly greater than a longitudinal width of the side wall 11B. Because the longitudinal width of the metal base 2 is equal to or slightly greater than the longitudinal width of the wiring layer 12H and the side wall 11B, the external circuit board to be assembled with the semiconductor device 1 is placed next thereto, which may shrink a plane size of an apparatus installing the semiconductor device 1 and the external circuit board.

Also, because the metal base 2 is retreated from the ends of the side wall 11B and the wiring layer 12H, and the side wall 11B and the wiring layer 12H provide vertical hollows 12n (11g), an equipment for assembling the semiconductor device 1 may hold the hollows 12n (11g) when the equipment places the semiconductor device 1 next to the external circuit board.

While, particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor device comprising:
    a metal base;
    a semiconductor chip provided on the metal base, the semiconductor chip outputting an amplified output signal from an input signal;
    a frame work located on the metal base, the frame work having a metal pattern including an input pattern configured to connect with an input of the semiconductor chip to provide the input signal to the input of the semiconductor chip, an output pattern configured to connect with an output of the semiconductor chip to output the amplified output signal from the semiconductor chip, and a bias pad configured to supply a bias voltage to the input of the semiconductor chip; and
    an elongated metal pattern electrically connected between the bias pad and the input pattern, wherein
    the bias pad and the elongated metal pattern supply a gate bias voltage to the input pattern of the semiconductor chip, and
    the elongated metal pattern has a characteristic of isolation at a frequency around the input signal so as to isolate the bias pad from the input pattern at frequencies around the input signal.

2. The semiconductor device according to claim 1, wherein the frame work has a thickness of 0.5 mm to 0.2 mm and is made of resin.

3. The semiconductor device according to claim 1, wherein
    the elongated metal pattern is adhered to the framework.

4. The semiconductor device according to claim 1, further having a matching unit provided on the metal base,
    wherein the gate bias voltage is supplied to the semiconductor chip from the bias pad via the matching unit.

5. The semiconductor device according to claim 1, further having a side wall fixed to the metal base and surrounding the periphery of the semiconductor chip, and the frame work fixed on the side wall.

6. The semiconductor device according to claim 5, wherein the side wall is made of resin.

7. A device comprising a frame work to be located on a metal base that has a semiconductor chip, the frame work having:
    a metal pattern including an input pattern configured to provide and input signal to the semiconductor chip, an output pattern configured to output an output signal from the semiconductor chip, and a bias pad; and
    an elongated metal pattern located on the frame work, the elongated metal pattern being electrically connected between the bias pad and the input pattern, wherein
    the bias pad and the elongated metal pattern supply a gate bias voltage to the semiconductor chip, and
    the elongated metal pattern has a characteristic of isolation at a frequency around the input signal at the input pattern so as to isolate the bias pad from the input pattern at frequencies around the input signal. output signal to be connected to the input pattern or the output pattern.

8. The device according to claim 7, wherein the frame work has a thickness of 0.05 mm to 0.02 mm and is made of resin.

9. The device according to claim 7, wherein
    the elongated metal pattern is adhered to the frame work.

10. A semiconductor device comprising:
    a metal base;
    a semiconductor chip provided on the metal base, the semiconductor chip outputting an amplified output signal from an input signal;
    a frame work located on the metal base, the frame work having a metal pattern including an input pattern configured to connect with an input of the semiconductor chip to provide the input signal to the input of the semiconductor chip, an output pattern configured to connect with an output of the semiconductor chip to provide the amplified output signal from the output of the semiconductor chip, and bias pads configured to supply bias voltages to the semiconductor chip;
    a first bonding wire electrically connecting one bias pad and the semiconductor chip to provide a gate bias voltage to the semiconductor chip; and
    a second bonding wire electrically connecting another bias pad to the semiconductor chip to provide a drain bias voltage to the semiconductor chip, wherein
    the first bonding wire bypasses the input pattern and the second bonding wire bypasses the output pattern in providing the biases to the semiconductor chip.

11. The semiconductor device according to claim 10, wherein the frame work has a thickness of 0.5 mm to 0.2 mm and is made of resin.

12. The semiconductor device according to claim 10, further having a side wall fixed to the metal base and surrounding a periphery of the semiconductor chip, and the frame work fixed on the side wall.

13. The semiconductor device according to claim 12, wherein the side wall is made of resin.

14. The semiconductor device according to claim 1, further comprising another bias pad and another elongated metal pattern electrically connected between the another bias pad and the output pattern, wherein
  the another bias pad and the another elongated metal pattern supply a drain bias to the semiconductor chip, and
  the another elongated metal pattern has a characteristic of isolation at a frequency around the input signal so as to isolate the another bias pad from the output pattern at frequencies around the input signal.

15. The semiconductor device according to claim 7, further comprising another bias pad and another elongated metal pattern electrically connected between the another bias pad and the output pattern, wherein
  the another bias pad and the another elongated metal pattern supply a drain bias to the semiconductor chip, and
  the another elongated metal pattern has a characteristic of isolation at a frequency around the input signal so as to isolate the another bias pad from the output pattern at frequencies around the input signal.

* * * * *